(12) United States Patent
Roy

(10) Patent No.: US 10,109,342 B2
(45) Date of Patent: Oct. 23, 2018

(54) DRAM ARCHITECTURE TO REDUCE ROW ACTIVATION CIRCUITRY POWER AND PERIPHERAL LEAKAGE AND RELATED METHODS

(71) Applicant: ATOMERA INCORPORATED, Los Gatos, CA (US)

(72) Inventor: Richard Stephen Roy, Dublin, CA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 15/592,464

(22) Filed: May 11, 2017

(65) Prior Publication Data

US 2017/0330609 A1    Nov. 16, 2017

Related U.S. Application Data

(60) Provisional application No. 62/381,207, filed on Aug. 30, 2016, provisional application No. 62/375,972, (Continued)

(51) Int. Cl.
*G11C 7/22* (2006.01)
*G11C 11/4074* (2006.01)
(Continued)

(52) U.S. Cl.
CPC .......... *G11C 11/4074* (2013.01); *G11C 5/148* (2013.01); *G11C 7/22* (2013.01);
(Continued)

(58) Field of Classification Search
CPC ............ G11C 11/4074; G11C 11/4085; G11C 11/4091; H01L 27/10897; H01L 29/152; H01L 29/16
(Continued)

(56) References Cited

U.S. PATENT DOCUMENTS 4,937,204 A    6/1990    Ishibashi et al.
5,216,262 A    6/1993    Tsu
(Continued)

FOREIGN PATENT DOCUMENTS

GB    2347520    6/2000

OTHER PUBLICATIONS

U.S. Appl. No. 15/664,028, filed Jul. 31, 2017.
(Continued)

*Primary Examiner* — Fernando Hidalgo
(74) *Attorney, Agent, or Firm* — Allen, Dyer, Doppelt + Gilchrist, P.A. Attorneys at Law

(57) ABSTRACT

A semiconductor device may include a plurality of memory cells, and at least one peripheral circuit coupled to the plurality of memory cells and comprising a superlattice. The superlattice may include a plurality of stacked groups of layers with each group of layers comprising a plurality of stacked base semiconductor monolayers defining a base semiconductor portion and at least one non-semiconductor monolayer thereon constrained within a crystal lattice of adjacent base semiconductor portions. The semiconductor device may further include a first power switching device configured to couple the at least one peripheral circuit to a first voltage supply during a first operating mode, and a second power switching device configured to couple the at least one peripheral circuit to a second voltage supply lower than the first voltage supply during a second operating mode.

23 Claims, 20 Drawing Sheets

Related U.S. Application Data filed on Aug. 17, 2016, provisional application No. 62/334,741, filed on May 11, 2016.

(51) Int. Cl.

| | | |
|---|---|---|
| *G11C 11/408* | (2006.01) | |
| *G11C 11/4091* | (2006.01) | |
| *H01L 27/108* | (2006.01) | |
| *H01L 29/15* | (2006.01) | |
| *H01L 29/16* | (2006.01) | |
| *G11C 5/14* | (2006.01) | |
| *H01L 21/8238* | (2006.01) | |
| *H01L 29/10* | (2006.01) | |

(52) U.S. Cl.
CPC ...... *G11C 11/4085* (2013.01); *G11C 11/4091* (2013.01); *H01L 21/823807* (2013.01); *H01L 27/10897* (2013.01); *H01L 29/1054* (2013.01); *H01L 29/152* (2013.01); *H01L 29/16* (2013.01); *G11C 2207/2227* (2013.01)

(58) Field of Classification Search
USPC .................. 365/189.011, 51, 63, 174, 226
See application file for complete search history.

(56) References Cited

U.S. PATENT DOCUMENTS

| | | | |
|---|---|---|---|
| 5,357,119 | A | 10/1994 | Wang et al. |
| 5,683,934 | A | 11/1997 | Candelaria |
| 5,796,119 | A | 8/1998 | Seabaugh |
| 6,141,361 | A | 10/2000 | Mears et al. |
| 6,376,337 | B1 | 4/2002 | Wang et al. |
| 6,472,685 | B2 | 10/2002 | Takagi |
| 6,741,624 | B2 | 5/2004 | Mears et al. |
| 6,830,964 | B1 | 12/2004 | Mears et al. |
| 6,833,294 | B1 | 12/2004 | Mears et al. |
| 6,878,576 | B1 | 4/2005 | Mears et al. |
| 6,891,188 | B2 | 5/2005 | Mears et al. |
| 6,897,472 | B2 | 5/2005 | Mears et al. |
| 6,927,413 | B2 | 8/2005 | Mears et al. |
| 6,958,486 | B2 | 10/2005 | Mears et al. |
| 6,962,018 | B1 | 10/2005 | Mears et al. |
| 6,993,222 | B2 | 1/2006 | Mears et al. |
| 7,018,900 | B2 | 3/2006 | Kreps |
| 7,033,437 | B2 | 4/2006 | Mears et al. |
| 7,034,329 | B2 | 4/2006 | Mears et al. |
| 7,045,377 | B2 | 5/2006 | Mears et al. |
| 7,045,813 | B2 | 5/2006 | Mears et al. |
| 7,071,119 | B2 | 7/2006 | Mears et al. |
| 7,105,895 | B2 | 9/2006 | Wang et al. |
| 7,109,052 | B2 | 9/2006 | Mears et al. |
| 7,123,792 | B1 | 10/2006 | Mears et al. |
| 7,148,712 | B1 | 12/2006 | Prey, Jr. et al. |
| 7,153,763 | B2 | 12/2006 | Hytha et al. |
| 7,202,494 | B2 | 4/2007 | Blanchard et al. |
| 7,227,174 | B2 | 6/2007 | Mears et al. |
| 7,229,902 | B2 | 6/2007 | Mears et al. |
| 7,265,002 | B2 | 9/2007 | Mears et al. |
| 7,279,699 | B2 | 10/2007 | Mears et al. |
| 7,279,701 | B2 | 10/2007 | Kreps |
| 7,288,457 | B2 | 10/2007 | Kreps |
| 7,303,948 | B2 | 12/2007 | Mears et al. |
| 7,432,524 | B2 | 10/2008 | Mears et al. |
| 7,435,988 | B2 | 10/2008 | Mears et al. |
| 7,436,026 | B2 | 10/2008 | Kreps |
| 7,446,002 | B2 | 11/2008 | Mears et al. |
| 7,446,334 | B2 | 11/2008 | Mears et al. |
| 7,491,587 | B2 | 2/2009 | Rao |
| 7,514,328 | B2 | 4/2009 | Rao |
| 7,517,702 | B2 | 4/2009 | Halilov et al. |
| 7,531,828 | B2 | 5/2009 | Mears et al. |
| 7,531,829 | B2 | 5/2009 | Blanchard |
| 7,531,850 | B2 | 5/2009 | Blanchard |
| 7,586,116 | B2 | 9/2009 | Kreps et al. |
| 7,586,165 | B2 | 9/2009 | Blanchard |
| 7,598,515 | B2 | 10/2009 | Mears et al. |
| 7,612,366 | B2 | 11/2009 | Mears et al. |
| 7,626,767 | B2 | 12/2009 | Huang et al. |
| 7,659,539 | B2* | 2/2010 | Kreps ............... H01L 21/28273 257/20 |
| 7,700,447 | B2 | 4/2010 | Dukovski et al. |
| 7,718,996 | B2 | 5/2010 | Dukovski et al. |
| 7,781,827 | B2 | 8/2010 | Rao |
| 7,812,339 | B2 | 10/2010 | Mears et al. |
| 7,863,066 | B2 | 1/2011 | Mears et al. |
| 7,880,161 | B2 | 2/2011 | Mears et al. |
| 7,928,425 | B2 | 4/2011 | Rao |
| 8,389,974 | B2 | 3/2013 | Mears et al. |
| 8,811,068 | B1 | 8/2014 | Clark et al. |
| 9,275,996 | B2 | 3/2016 | Mears et al. |
| 9,406,753 | B2 | 8/2016 | Mears et al. |
| 9,558,939 | B1 | 1/2017 | Stephenson et al. |
| 9,741,428 | B2* | 8/2017 | Clark .................... G11C 11/412 |
| 2003/0034529 | A1 | 2/2003 | Fitzgerald et al. |
| 2003/0057416 | A1 | 3/2003 | Currie et al. |
| 2006/0220118 | A1 | 10/2006 | Stephenson et al. |
| 2007/0012910 | A1 | 1/2007 | Mears et al. |
| 2007/0020833 | A1 | 1/2007 | Mears et al. |
| 2008/0012004 | A1 | 1/2008 | Huang et al. |
| 2008/0258134 | A1 | 10/2008 | Mears et al. |
| 2011/0215299 | A1 | 9/2011 | Rao |
| 2014/0313819 | A1 | 10/2014 | Choi et al. |
| 2014/0325249 | A1* | 10/2014 | Toyotaka ........... G11C 14/0018 713/323 |
| 2015/0357414 | A1 | 12/2015 | Mears |
| 2016/0099317 | A1 | 4/2016 | Mears et al. |
| 2016/0111495 | A1* | 4/2016 | Brand ................. H01L 29/0673 438/283 |
| 2016/0149023 | A1 | 5/2016 | Mears et al. |
| 2016/0336406 | A1 | 11/2016 | Mears et al. |
| 2016/0336407 | A1 | 11/2016 | Mears et al. |
| 2016/0358773 | A1 | 12/2016 | Mears et al. |
| 2017/0169874 | A1* | 6/2017 | Dray ................... G11C 11/1697 |
| 2017/0271341 | A1* | 9/2017 | Tanaka .............. H01L 27/10897 |
| 2017/0294514 | A1 | 10/2017 | Mears |
| 2017/0301757 | A1 | 10/2017 | Mears et al. |

OTHER PUBLICATIONS

U.S. Appl. No. 15/670,231, filed Aug. 7, 2017.
U.S. Appl. No. 15/670,240, filed Aug. 7, 2017.
U.S. Appl. No. 15/670,266, filed Aug. 7, 2017.
U.S. Appl. No. 15/670,274, filed Aug. 7, 2017.
U.S. Appl. No. 15/678,616, filed Aug. 16, 2017.
U.S. Appl. No. 15/678,658, filed Aug. 16, 2017.
Luo et al., "Chemical Design of Direct-Gap Light-Emitting Silicon" published in Physical Review Letters, vol. 89, No. 7; Aug. 12, 2002; 4 pgs.
Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.
Novikov et al. "Silicon-based Optoelectronics" 1999-2003, pp. 1-6.
R. Tsu Phenomena in silicon nanostructure device published online Sep. 6, 2000 by Applied Physics and Materials Science & Processing, pp. 391-402.
Raphael Tsu "Si Based Green ELD: Si-Oxygen Superlattice" wysiwyg:// t/http://www3.interscience.wiley.com/cgi-bin/abstract/72512946/ start: published online Jul. 21, 2000; 2 pgs. Abstract Only.
Xu et al., "Effectiveness of Quasi-confinement technology for improving P-chanel Si an Ge MOSSFET performance" Department of Electrical Engineering and Computer Science, University of California, Berkeley, 2012, pp. 2. mearstech.net: retrieved from internet Jan. 18, 2016.
Xu et al. "Extension of planar bulk n-channel MOSFET scaling with oxygen insertion technology" IEEE Transactions on Electron devices, vol. 61, No, 9; Sep. 2014. pp. 3345-3349.
Xu et al., "MOSFET performance and scalability enhancement by insertion of oxygen layers", Department of Electrical Engineering

(56) References Cited

OTHER PUBLICATIONS and Computer Science, University of California, Berkeley, 2012, pp. 1-4.

* cited by examiner

DRAM ARCHITECTURE TO REDUCE ROW ACTIVATION CIRCUITRY POWER AND PERIPHERAL LEAKAGE AND RELATED METHODS

CROSS-REFERENCE TO RELATED APPLICATIONS

The present application claims the benefit of provisional application nos. 62/334,741 filed May 11, 2016; 62/375,972 filed Aug. 17, 2016; and 62/381,207 filed Aug. 30, 2016, all of which are hereby incorporated herein in their entireties by reference.

TECHNICAL FIELD

The present disclosure generally relates to semiconductor devices and, more particularly, to semiconductor memory devices and related methods.

BACKGROUND

One important requirement for DRAM (Dynamic Random Access Memory) devices is the ability to hold data in an inactive state with the minimum power drain. This power drain comes from the need to refresh the data stored in bit cells in selected portions of the memory, as well as leakage in the rest of the periphery. This specification is referred to as IDD6. This directly affects the usable time from a battery charge for smart phones, laptops, etc. Another important parameter for DRAM devices is latency. Latency is the delay between selecting a random location within the memory device and the arrival of the selected data on the outputs.

One particularly advantageous memory device is set forth in U.S. Pat. No. 7,659,539 to Kreps et al., which is assigned to the present Assignee and hereby incorporated herein in its entirety by reference. This patent discloses a semiconductor device which includes a semiconductor substrate and at least one non-volatile memory cell. The at least one memory cell may include spaced apart source and drain regions, and a superlattice channel including a plurality of stacked groups of layers on the semiconductor substrate between the source and drain regions. Each group of layers of the superlattice channel may include a plurality of stacked base semiconductor monolayers defining a base semiconductor portion and an energy band-modifying layer thereon, which may include at least one non-semiconductor monolayer constrained within a crystal lattice of adjacent base semiconductor portions. A floating gate may be adjacent the superlattice channel, and a control gate may be adjacent the second gate insulating layer.

Despite the advantages of such devices, further developments in memory technology may be desired in certain applications, such as where reduced power drain and latency are desired.

SUMMARY

A semiconductor device may include a plurality of memory cells, and at least one peripheral circuit coupled to the plurality of memory cells and comprising a superlattice. The superlattice may include a plurality of stacked groups of layers with each group of layers comprising a plurality of stacked base semiconductor monolayers defining a base semiconductor portion and at least one non-semiconductor monolayer thereon constrained within a crystal lattice of adjacent base semiconductor portions. The device may further include a first power switching device configured to couple the at least one peripheral circuit to a first voltage supply during a first operating mode, and a second power switching device configured to couple the at least one peripheral circuit to a second voltage supply lower than the first voltage supply during a second operating mode.

More particularly, in an example embodiment the first operating mode may comprise an active mode, and the second operating mode may comprise a standby mode. By way of example, the at least one peripheral circuit may comprises a sense amplifier. In accordance with another example, the at least one peripheral circuit may comprise a main wordline decoder (MWD) circuit, as well as a wordline pre-decoder circuit coupled to the MWD circuitry. In addition, the at least one peripheral circuit may comprises an address decoder circuit in another example implementation. Furthermore, the at least one peripheral circuit may include at least one transistor having a source and a drain, and the superlattice may define a channel between the source and the drain.

Furthermore, each base semiconductor portion may comprise silicon, germanium, etc., for example. Also by way of example, the at least one non-semiconductor monolayer may comprise a non-semiconductor selected from the group consisting of oxygen, nitrogen, fluorine, and carbon-oxygen. In addition, at least some semiconductor atoms from opposing base semiconductor portions of each superlattice layer may be chemically bound together through the non-semiconductor layer therebetween.

A related method for making a semiconductor device is also provided. The method may include forming a plurality of memory cells, and forming at least one peripheral circuit coupled to the plurality of memory cells and comprising a superlattice, as discussed briefly above. The method may also include forming a first power switching device configured to couple the at least one peripheral circuit to a first voltage supply during a first operating mode, and forming a second power switching device configured to couple the at least one peripheral circuit to a second voltage supply lower than the first voltage supply during a second operating mode.

DETAILED DESCRIPTION

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

MST technology for CMOS devices from Atomera Technologies, Inc., which is described further below with reference to FIGS. 11-14C, has the capability to operate with significant overdrive voltage compared to standard CMOS devices. As a result, the performance of MST-based devices is up to 70% higher than standard CMOS technology, which can translate into a 70% reduction in latency. An example approach for integrating MST technology in CMOS devices is set forth in U.S. Pat. No. 6,878,576 to Mears et al., which is hereby incorporated herein in its entirety by reference.

During IDD6 standby where the data in the array is continually refreshed, however, it is not necessary to operate at the same speed as during the faster active mode made possible by the use of MST technology. The specification for the time a bit cell can reliably store the data is easily long enough for the entire array to be fully refreshed at the current performance levels of the Row Activation circuitry. As a result, this creates an opportunity to operate the Row activation path of the circuit at a significantly lower voltage, while maintaining the clock rate at current levels (as opposed to the faster levels made possible by overdriven MST technology). By reducing the VDD applied to these circuits from 1.0V to 0.7V, for example, the array can be fully refreshed at current speeds, thus allowing this portion of the standby power to be reduced by approximately 50%, as will be discussed further below. The present invention describes a modification to the typical DRAM architecture that allows such a power reduction during IDD6 standby mode.

A further characteristic of MST technology is that high Vt and low Vt devices may each be optimized separately on the same chip. By optimizing the high Vt devices for minimal leakage, they may be used as headers for reducing leakage in the rest of the periphery during standby mode, while allowing optimization of the low Vt devices in these paths to be even faster than the 70% improvement referred to above during active mode.

Figure 1:
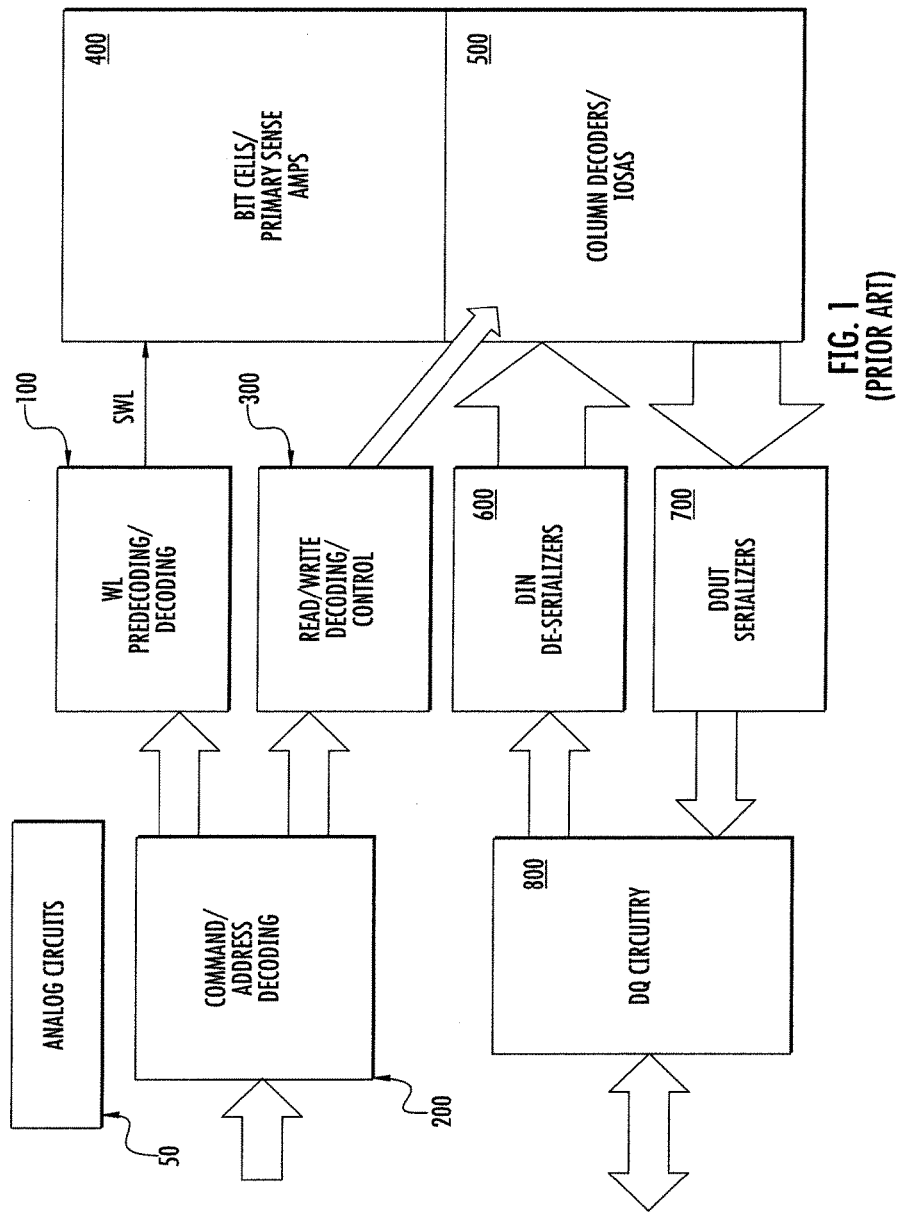
FIG. 1 is a schematic block diagram of a typical DRAM architecture in accordance with the prior art.

Referring initially to FIG. 1, a typical DRAM architecture is first described by way of background. Inputs come into the chip on the left side, into block 200. This represents the logic for decoding address information for the selected cells as well as control information to determine the type of operation to be performed. Part of this information is fed into the Word Line Pre-decoding and decoding circuitry, otherwise known as Row Activation circuitry, represented by block 100. The other part of this information is fed into block 300, which is Read/Write Decoding and Control. The terms Read and Write refer to column operations only to previously Activated Rows. This circuitry is not operated during refresh-only operations, where the data is not read to or written from the outside world. During Read and Write operations, the outputs of this circuitry are fed into block 500, which contains Column Decoders and Secondary Sense Amps (IOSAs) which interface directly to the memory array 400, which includes all Bit Cells and Primary Sense Amps. Block 100, which includes Word Line Pre-decoding and Decoding circuitry, also interfaces directly to the bit cells in the memory array 400. Block 500 also interfaces directly with blocks 600 and 700, the data in and data out paths. Frequently the internal bus width of the DRAM is much wider than the external interfaces, so the data in and data out paths include serialization (for data out) and de-serialization (for data in). Finally, the data in and data out paths are combined at block 800, which is the bidirectional DQ circuitry that interfaces with the outside world.

Figure 17:
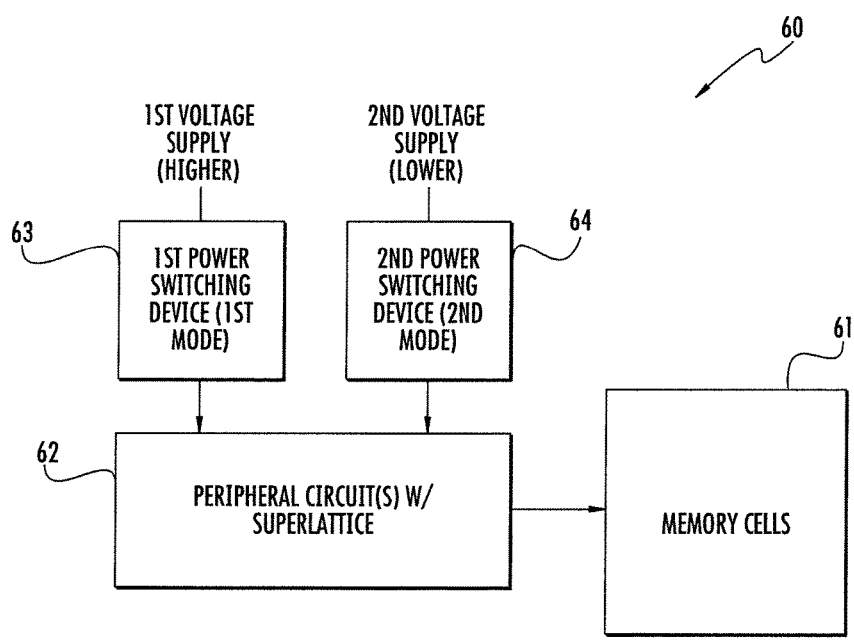
FIG. 17 is a schematic block diagram of a memory device in accordance with an example embodiment.
Figure 18:
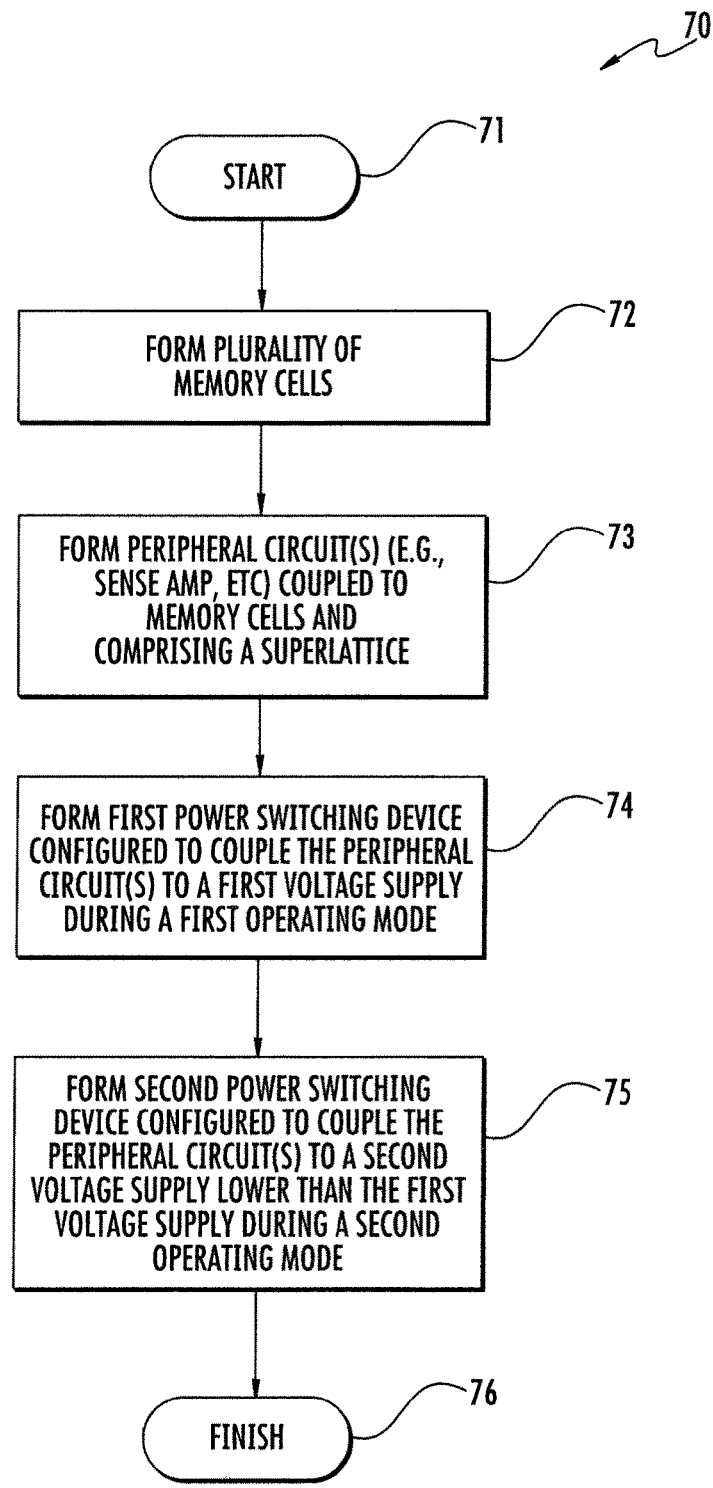
FIG. 18 is a flow diagram illustrating a method for making the memory device of FIG. 17.

Turning now to FIG. 17 and the flow diagram 70 of FIG. 18, an example semiconductor device 60 and related method for making the device (which begins at Block 71) are first described. The device 60 illustratively includes a plurality of memory cells 61 (formed at Block 72), and one or more peripheral circuits 62 (e.g., sense amplifier, etc.) coupled to the memory cells and comprising an MST superlattice (which is formed at Block 73) and will be discussed further below. The device further illustratively includes a first power switching device 63 (formed at Block 74) configured to couple the peripheral circuit(s) to a first voltage supply (e.g., Vdd) during a first operating mode (e.g., an active mode), and a second power switching device 64 (formed at Block 75) configured to couple the peripheral circuit(s) to a second voltage supply (e.g., Vdd1) lower than the first voltage supply during a second operating mode. The method of FIG. 18 illustratively concludes at Block 76. It should be noted that the various steps of FIG. 18 need not be performed in the exact order shown in all embodiments, but rather some of these steps may be performed in a different order or concurrently, for example.

Figure 2:
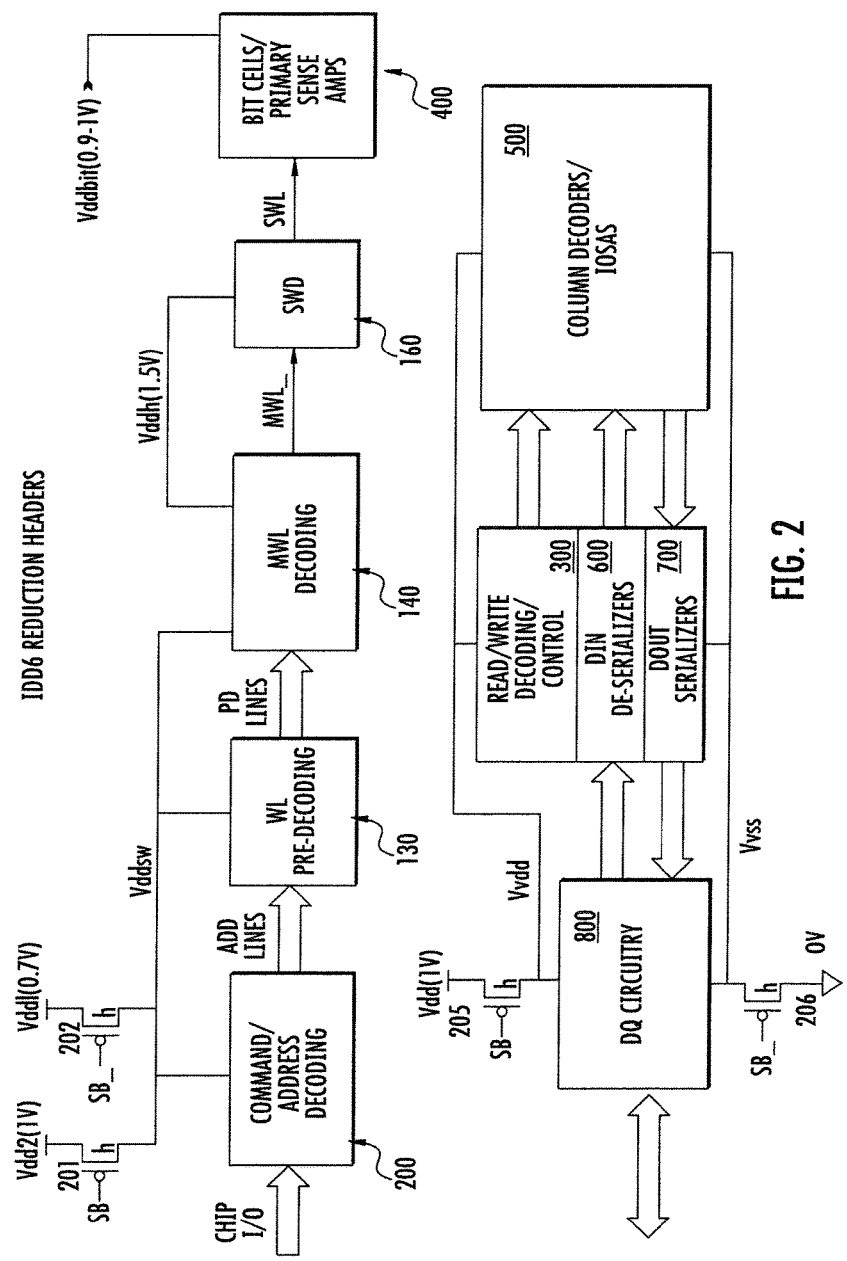
FIG. 2 is a schematic block diagram of a DRAM architecture in accordance with an example embodiment.

Turning now to FIG. 2, a modification of the architecture of FIG. 1 is shown that includes key "header devices" in accordance with an example embodiment. Row Activation (Word Line Pre-decoding and Decoding circuitry) block 100 has been subdivided into block 130 (WL Pre-decoding), block 140 (MWL Decoding) and block 160 (SWD, or Sub Word Drivers). Block 160 drives the actual Word lines that connect to the bit cells in block 400 (Bit Cells and Primary Sense Amps). Blocks 200, 130, and parts of 140 are powered by Vddsw, which is switched from 1V during normal operation to 0.7V (or some such lower voltage) during standby. When standby mode is entered, SB goes high, disabling PMOS device 201, while at the same time SB_ (SB inverted) goes low, enabling device 202. The net result is the reduction of Vddsw from 1V to 0.7V, with some reasonably long slew rate due to all of the parasitic capacitance on this node. This is shown in the timing diagram of FIG. 3.

The bit cells and primary sense amps (block 400) are driven by Vddbit, which is usually in the range of 0.9V to 1.0V for both active and standby modes, which is similar to the configuration of FIG. 1. Likewise, the MWD (Main Wordline Decoder, block 140), and SWD (Sub Word Driver, block 160) are powered by Vddh (approximately 1.5V), which is also similar to the architecture of FIG. 1. The detailed operation of the blocks 140 and 160 will be described further below with reference to FIGS. 6-9.

Figure 3:
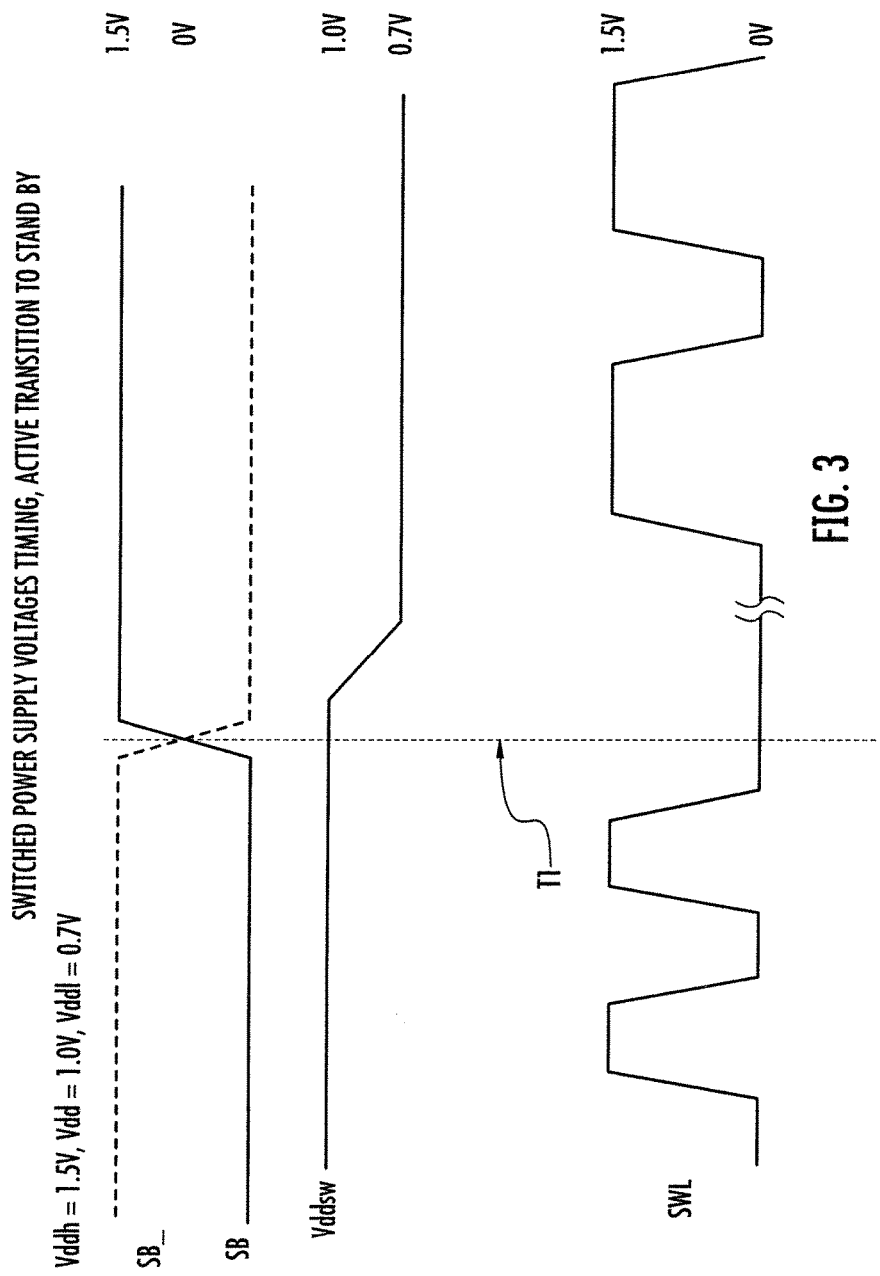
FIG. 3 is a timing diagram illustrating operation of the DRAM architecture of FIG. 2.

Note also in the timing diagram of FIG. 3 the timing of the Sub Word Lines (SWL). The first two pulses are random active SWL lines operating at normal frequency. Due to the operation of the Row Activation circuitry 100 at 0.7V, once Standby mode is entered at time T1, the frequency of the SWL is now reduced by 70%. The external clocks may be slowed down by this much during Standby.

Starting along the bottom, the 5 blocks 300, 500, 600, 700, and 800 are not needed for refresh, so by inserting a high Vt header 205 to Vdd and footer 206 to Vss for all of these blocks, the low Vt devices that make up the logic, drivers, secondary sense amps, etc., in these paths may be optimized for enhanced performance at the expense of leakage (i.e., lower Vt). The upper limit for total leakage of these low Vt devices is the point where the leakage starts to become noticeable in power during active mode. The signals that control these headers are SB (Standby) and SB_ (Standby inverted). When SB goes high (going into IDD6 standby mode) at T1, these devices are turned off, thus limiting the leakage of all these blocks to the leakage of these High Vt devices, regardless of the leakage characteristics of the Low Vt devices that make up the logic, drivers, secondary sense amps, etc., in these paths.

Figure 4:
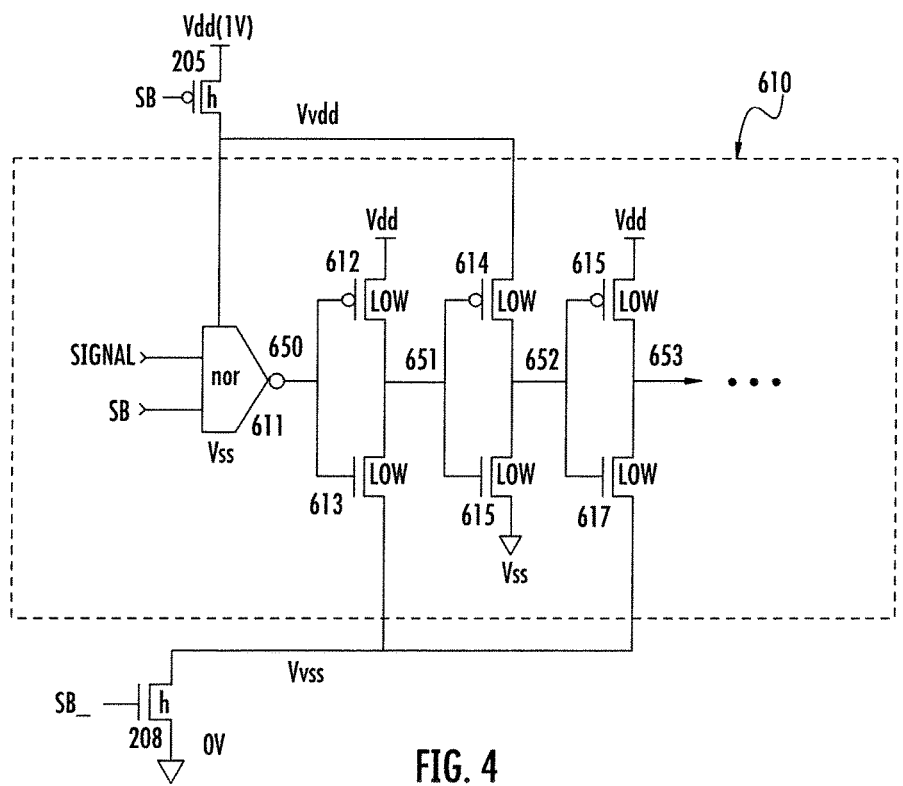
FIG. 4 is a schematic circuit diagram of an example header configuration for the DRAM architecture of FIG. 2.

The functionality of these headers is now described in greater detail with respect to FIG. 4. By only inserting high Vt header devices to Vdd, the standby power may be reduced as mentioned above. However, all the internal nodes will drift to indeterminate states without any connections to Vdd. To obtain the advantage of lower leakage due to High Vt header (and footer) devices while keeping all internal nodes in a known state, the circuitry may be hooked up as shown FIG. 4. This is representative of the style of header connections that would be followed throughout the implementation of blocks 300, 500, 600, 700, and 800. The dots after that output of the last inverter indicate that this connection style would be implemented throughout all of these blocks. At the beginning of the path there may be an insertion of SB into a NOR gate 611 (or SB_ into a NAND gate, if that is more convenient) as shown. The circuitry in these blocks is completely unused during standby (IDD6 mode), so they should be put into a state such that the outputs do not cause any harm to the DQ circuitry (block 800) of the chip.

In order for the NOR gate 611 example as shown to be put into a known state during standby, the NMOS devices may be hooked to Vss. Yet, the top PMOS device is hooked to Vvdd (Virtual Vdd) so that its leakage is determined by the high Vt header 205 rather than the low Vt (higher performance) devices in the NOR gate. For this example, the NOR gate 611 drives 3 inverters in succession. This illustrates the connection of VVdd and Vvss to the source nodes of these circuits. Since NOR gate 611 output 650 is held at ground (with now a very low leakage path to Vdd through the header), the next stage should be connected in an opposite fashion. Now the NMOS device 613 is connected through a low leakage high Vt footer to ground, and the PMOS pullup 612 is connected directly to Vdd, since it is being driven by a low level from the NOR gate 611 in standby mode (after T1 on FIG. 3). Now the output node 651 is being held by a direct connection to Vdd, but the pulldown's leakage is determined by the high Vt footer 206. Likewise, every stage after that alternates in their connections to the actual power supplies (Vdd and Vss) or the header PMOS 205 or footer NMOS 206. Output 652 is held to Vss by NMOS device 615 (while PMOS device 614 is connected to the header output Vvdd by PMOS 614). The last stage is flipped again (PMOS device 616 to Vdd, NMOS device 617 to Vvss).

Figure 5:
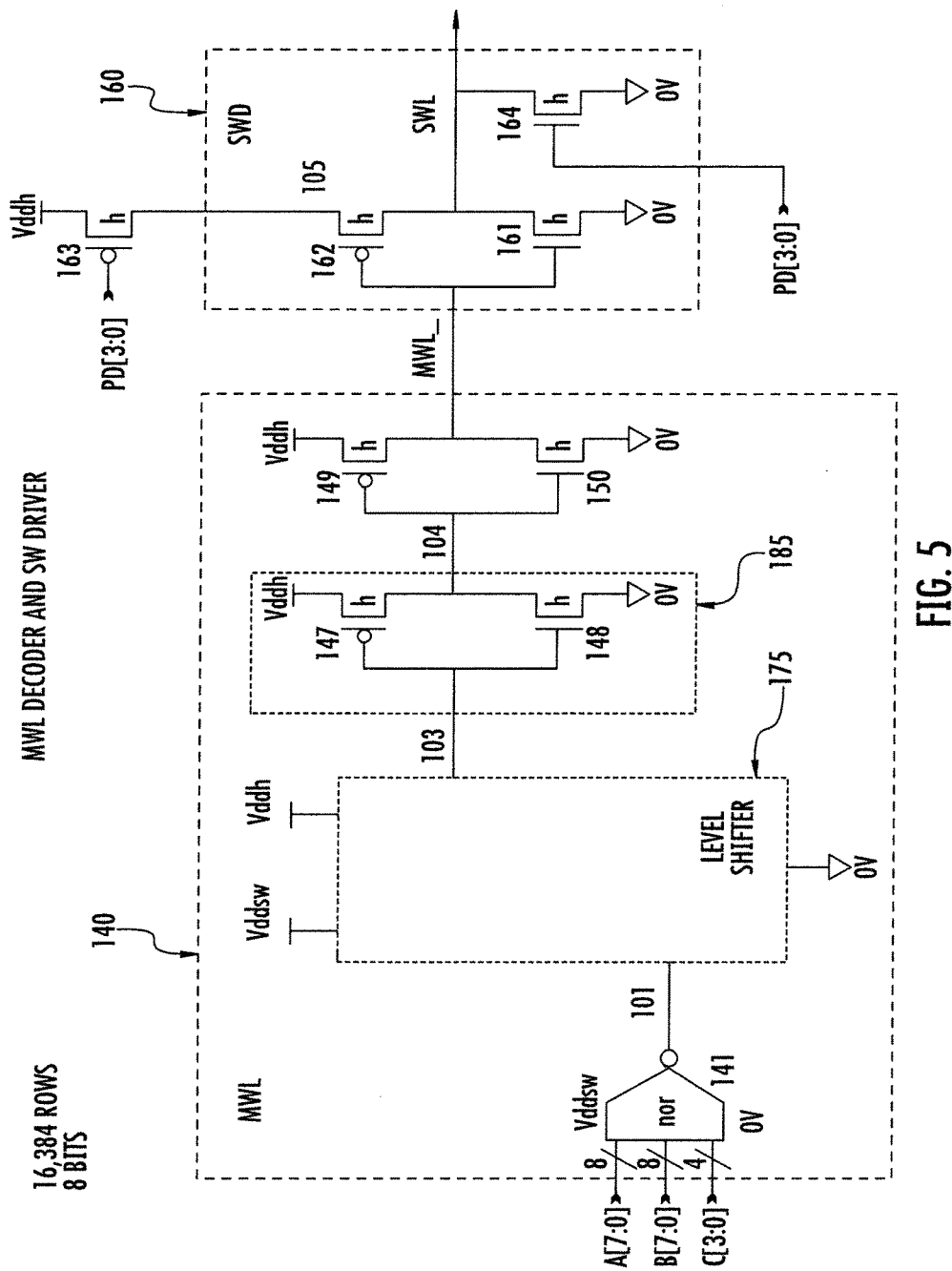
FIG. 5 is a schematic circuit diagram of an example embodiment of the MWL decoding and SWD blocks of FIG. 2.
Figure 6:
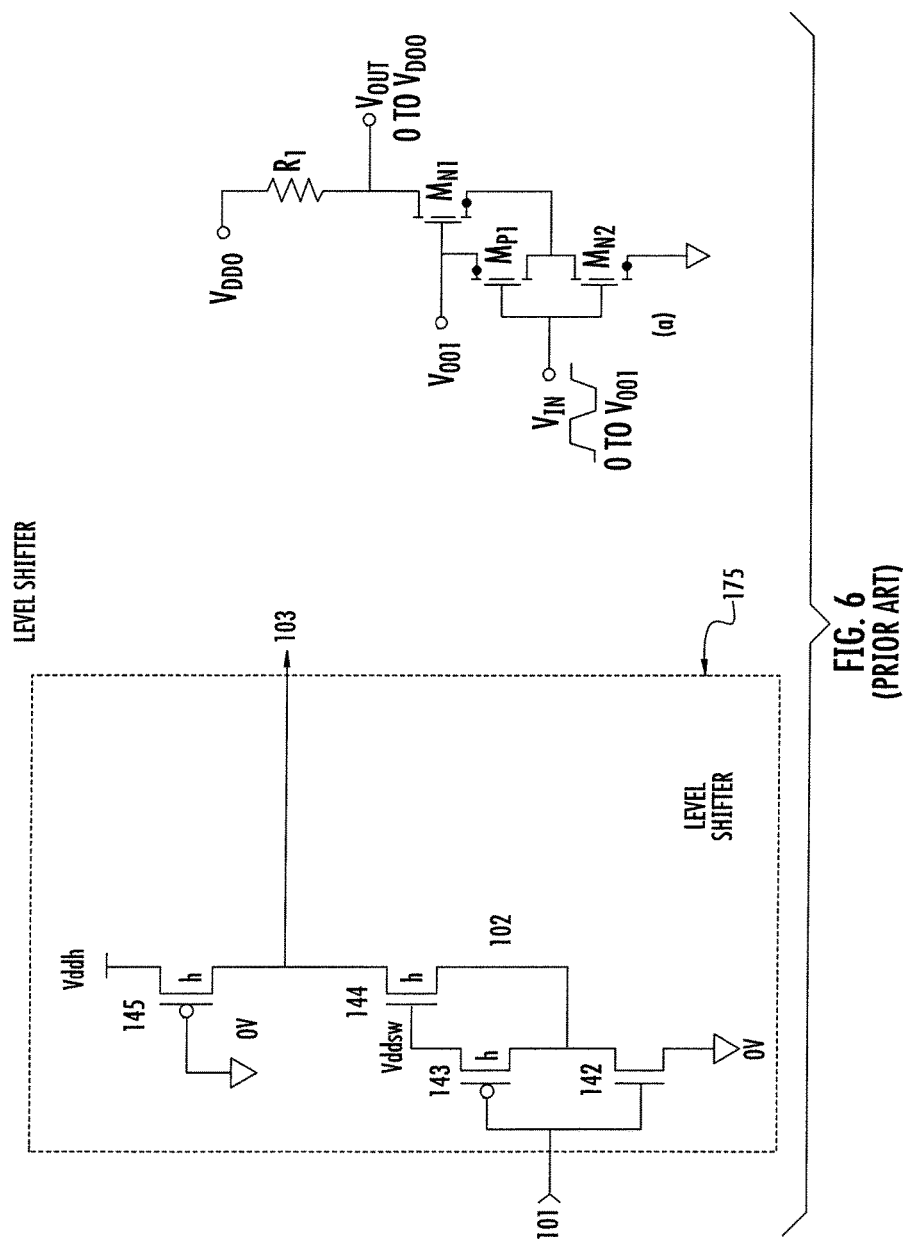
FIG. 6 is a schematic circuit diagram of a level shifter in accordance with the prior art.

FIG. 5 provides more detail of an example configuration of the MWL circuit 140 and SWD circuit 160 of FIG. 2. NOR gate 141 is driven by 3 sets of predecoded addresses A[7:0], B[7:0], and C[3:0]. This assumes the final MWL decoder decodes to 16,384 bits, which is common in modern DRAM architectures. In a typical configuration, the PMOS source connection of the 3 stack for this NOR gate would be connected to Vdd (typically 1V). In the present example, this connection is now to Vddsw. As previously described, Vddsw is switched from 1V to 0.7V in standby by the 2 high Vt header devices 201 and 202 in FIG. 2. Therefore, the input to the level shifter (node 101) swings from 0 to 1V in active mode, and from 0 to 0.7V in standby mode. The output node of the level shifter (node 103) ideally swings from 0V to 1.5V in both active and standby modes. There are complex level shifter circuits that give full CMOS levels on the outputs, but it would be impractical to include such a complex circuit (upwards of 10-12 transistors) in the very area constricted portion of the chip near the array, where there is a MWL for every 4 Sub Word Lines (extremely tight pitch in modern DRAMs). So in practice, the 2 versions of the level shifter to be described here (the prior art version FIG. 6 and the example implementation shown in FIG. 7) may be used. Yet, they are ratioed circuits where the PMOS pullup is still driving current to some degree when the NMOS pulldown is driving the output near ground.

There are certain operating considerations for the level shifter. First, under all conditions (particularly strong P, weak N, and 0.7V on Vddsw), the output node 103 should be pulled well enough below the input trip point of inverter 185 so that the output of the inverter (node 104) reaches the full CMOS level (1.5V). Thus, the drive strength of the p-channel pullup network in the level shifter 175 may be significantly less than the drive strength of the NMOS pulldown network. Yet, this creates a situation where the high-going slew rate of node 103 when the input transitions to ground is extremely slow (see the box 90 in the timing diagram in FIG. 9). See also the prior art level shifter in FIG. 6, and the associated box 80 in the timing diagram of FIG. 8. PMOS 145 should be sized small enough to allow NMOS 142 and 144 to easily overcome it and pull node 103 very close to Vss when the SWL is selected. Consider the case where the node 103 nominally swings from 1.5V to 0.3V. The gate to source (Vgs) voltages on NMOS 142 and 144 are 0.7V, and Vgs on P 145 is −1.5V. So W/L of P 145 should be well more than 10×less than the net W/L of N 142 and N 144 in series. Another issue is that there is a small amount of DC current in this ratio which adds to the power, but it is in the state where the SWL is being selected, so it is only for the one selected SWL vs. the other 16,383 unselected SWLs. If it were in the other direction, these few uA would multiply to a completely unacceptable number.

Figure 7:
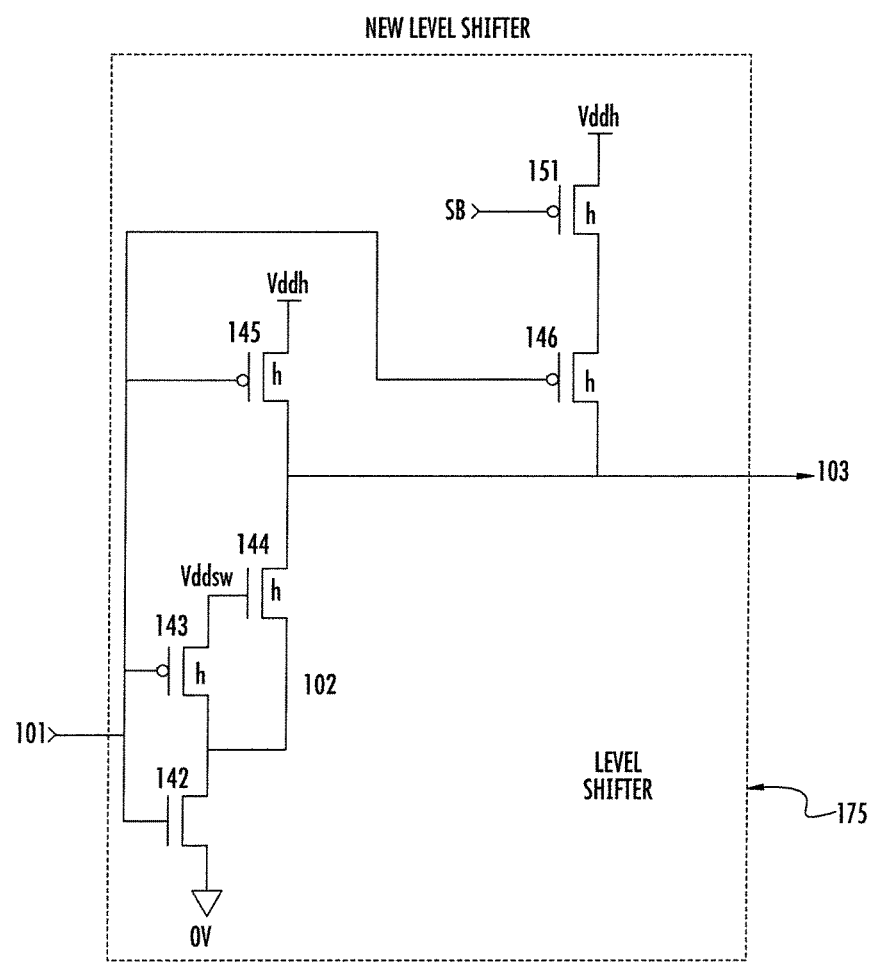
FIG. 7 is a schematic block diagram of a level shifter in accordance with an example embodiment.
Figure 8:
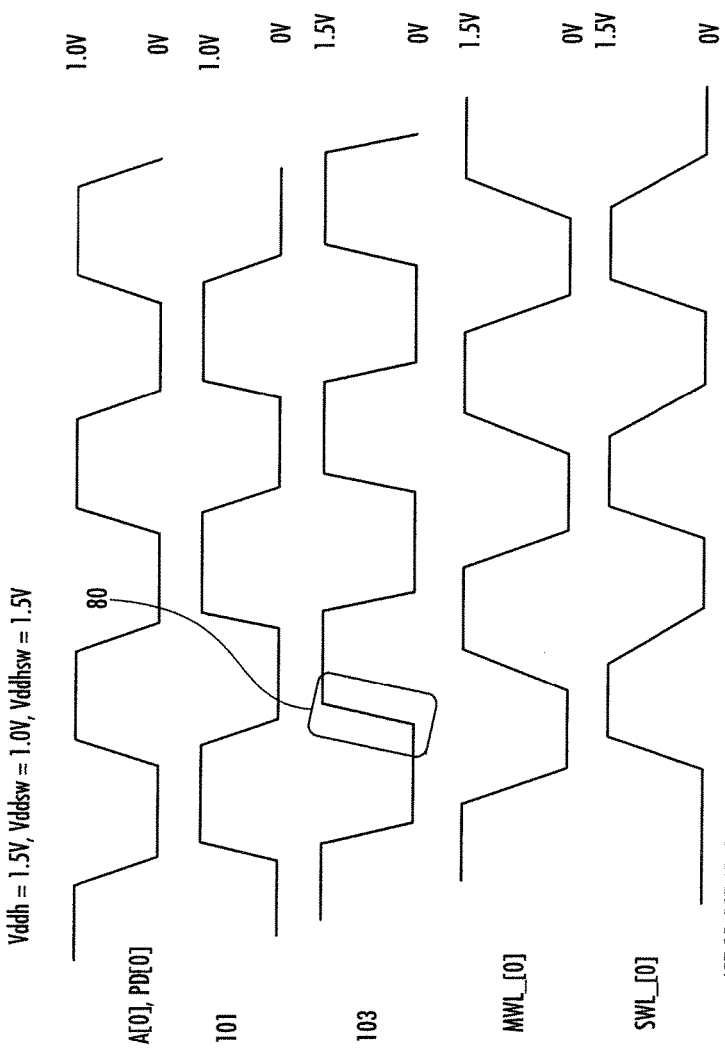
FIG. 8 is a timing diagram illustrating MWL decoder and SWD timing in an active mode in accordance with an example embodiment.
Figure 9:
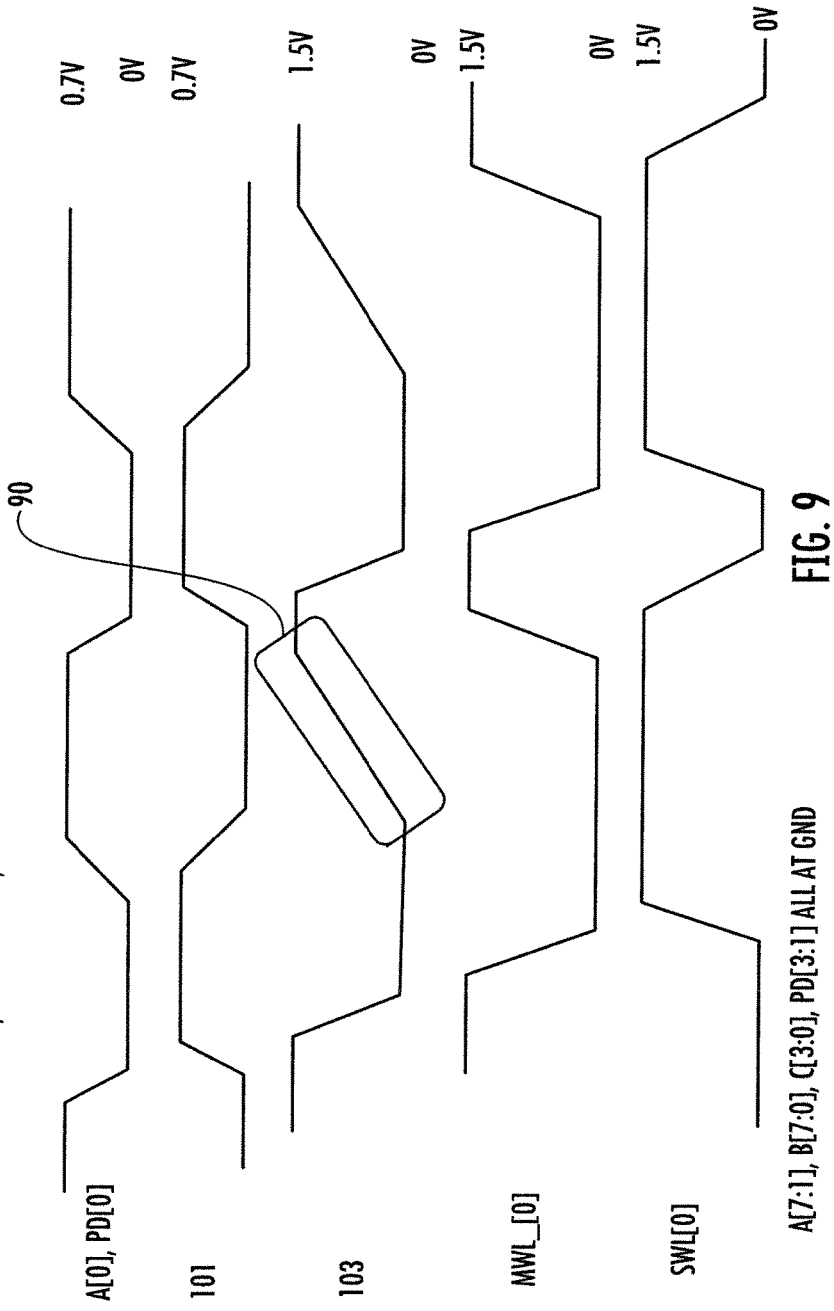
FIG. 9 is a timing diagram illustrating MWL decoder and SWD timing in a refresh mode in accordance with an example embodiment.

FIG. 7 shows the level shifter in accordance with an example embodiment. PMOS 145 should still be sized small enough to allow NMOS 142 and 144 to easily overcome it and pull node 103 very close to Vss when the SWL is selected, but now the gate voltage of PMOS 145 is tied to the input, which is at 0.7V when 103 is being driven to ground, vs. tied to Gnd in the prior art configuration. Suppose Vtp for a high Vt PMOS is 0.5V. The difference in current drive for the same sized device (as P 145 in FIG. 6) is $(0.3)^2$ vs. $(1)^2$. Therefore, PMOS 145 in the PI may be sized over 10 times larger to give the same ratio vs. the NMOS pulldowns. Thus, the rise time of node 103 in Standby will be 10× faster.

For the architecture described in the example embodiments, this slow rise time of node 103 when de-selecting the SWL is somewhat acceptable during standby, since we are slowing down the Refresh cycle time (compared to the active cycle time) by operating the peripheral circuitry at 0.7V, while maintaining Vddh in the array. Thus, the speed of operation for reading the contents of the bit cells to the primary sense amplifiers is the same. Yet, during active operation (which will be 70% faster than existing designs once MST technology is enabled), the duty cycle of the SWL selection should be relatively close to 50% to handle the much faster frequencies enabled by MST technology during active mode.

In addition, the PI includes two additional PMOS devices in series (P146 and 151). They are only enabled during active mode (SB on the gate of PMOS 151 goes low) to make the rise time faster during active mode. When the input node 101 is high (1.0V), the high Vt PMOS devices 145 and 146 are just at Vtp, and draw almost no current. Therefore PMOS 146 and 151 may be as large as is practical in the area available. When the input 101 falls to 0, PMOS 145 (whose size was determined by the ratio in standby mode) is turned on in parallel to PMOS devices 146 and 151 in series, making the rise time of node 103 extremely fast.

Figure 10:
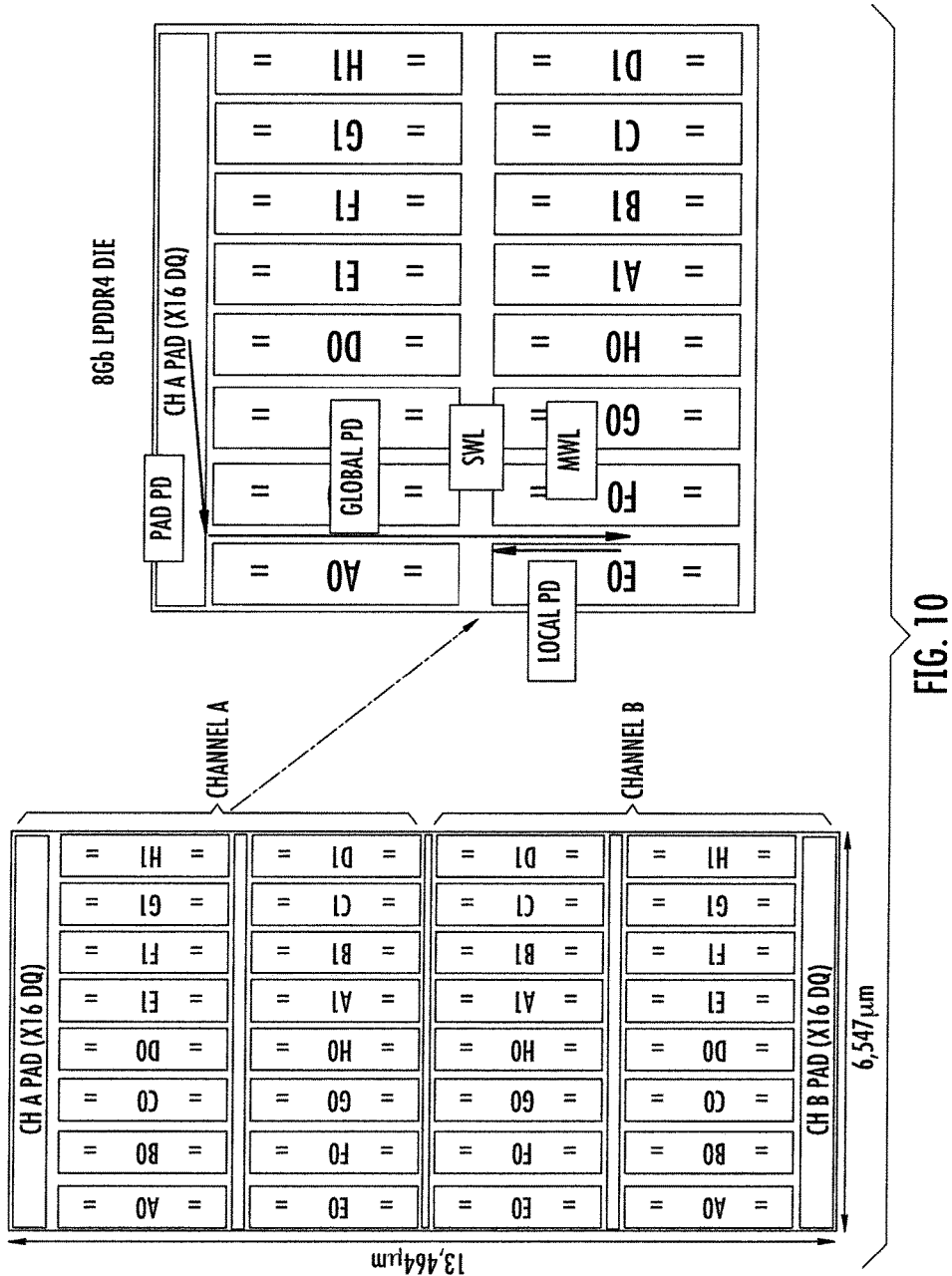
FIG. 10 is a top view of a DRAM configuration in which the architecture of FIG. 2 may be implemented in accordance with an example embodiment.

Turning to FIG. 10, a die photograph of a typical modern LPDDR4 DRAM is shown to illustrate how the above-described configurations may be implemented therein. The pathways Pad PD, Global PD, and Local PD are those whose AC power can be reduced by half by implementing the above-described configuration. The final pathways MWL and SWL remain at Vddh (1.5V), but they are much shorter than the pathways marked in yellow.

Figure 15:
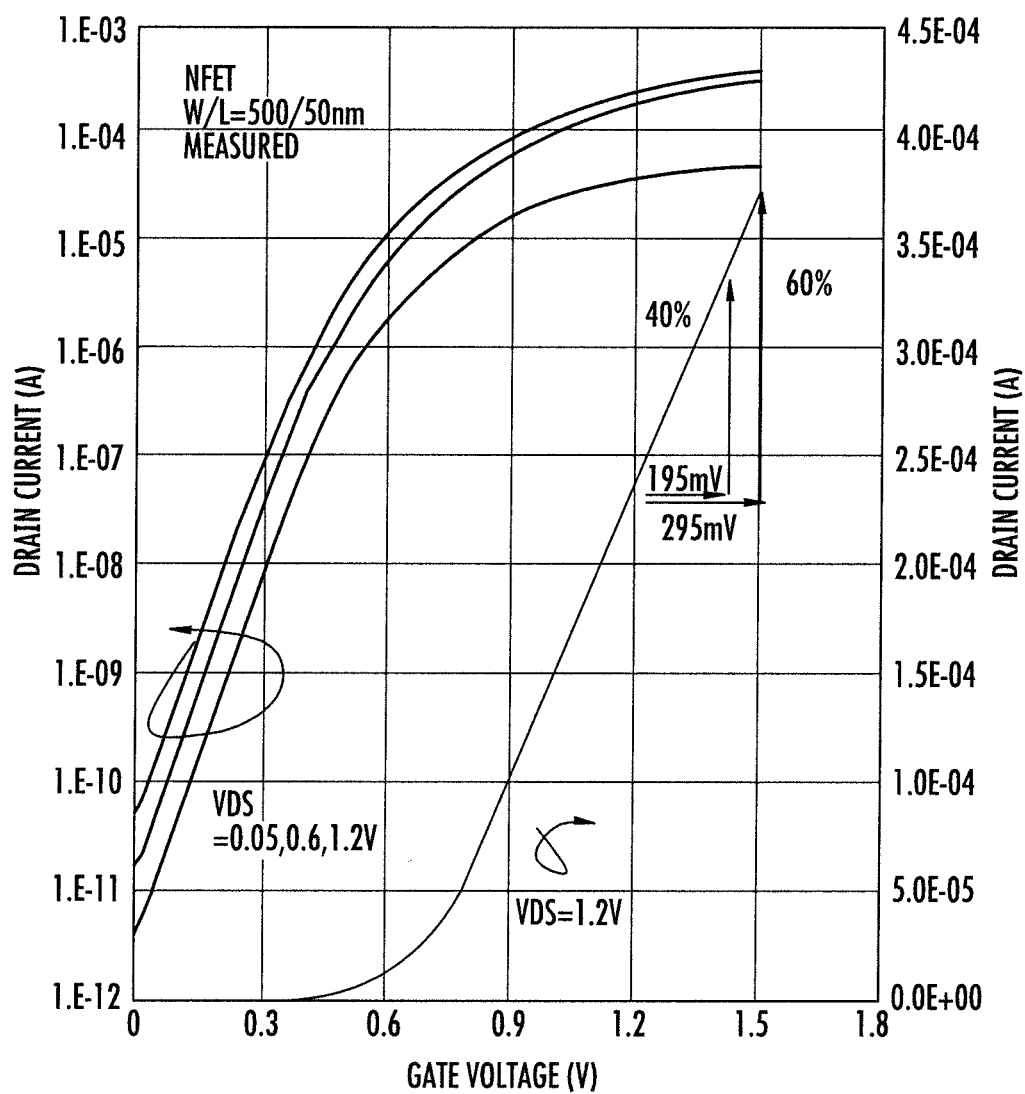
FIG. 15 is a graph illustrating simulated drain current vs. gate voltage for a memory device including a superlattice in accordance with an example embodiment.

Referring additionally to the graph 250 of FIG. 15 showing simulated drain current vs. gate voltage for an example memory device including an MST superlattice, it will be seen that substantially the same performance is achieved when Vdd2 goes from 1V to 0.7V. With this configuration, a ~200-300 mV higher gate bias is feasible by MST TDDB improvement. Moreover, the Ioff increase by higher Vds is estimated to be ~30-40% for +200 mV, and ~60-70% for +300 mV, respectively. These may be offset by setting Vt higher by +5 mV. Furthermore, at the same Ioff, additional gain may be achieved with increased gate overdrive, and with an estimated reliability improvement of ~40%-60%.

The power savings which may be achieved using the above-described approach will be further understood with reference to an example implementation using $I_{DD}$ specifications for a Micron Dual-Channel LPDDR3 SDRAM (although the techniques described herein may be used with other types of DRAM devices). For active read and write modes (no row activation), power is almost entirely in Vdd2 (1.2V for LPDDR3, 1.1V for LPDDR4). That is, it is in the read and write paths, not Vddbit. Upon activation, power is in Vdd1 (1.8V) and Vdd2 (1.2V). Vdd2 still dominates, but not as much. Vddbit is regulated from the lower Vdd2 voltage. During an all bank auto-refresh burst current, power is in Vdd1 (1.8V) and Vdd2 (1.2V). Since multiple banks are being refreshed at the same time, this is more or less a scaled up version of the "activate" power numbers. However, during standby (IDD6), power is in Vdd1 and Vdd2 and Vdd2 is still very dominant with bit $CV^2f$ being the biggest component. Applicant theorizes, without wishing to be bound thereto, that Vddbit comes from Vdd2. The ratio of Idd2 vs Idd1 is 7:1 as additional portions of the array are refreshed, vs. about 5:1 in the Activate and burst refresh cases. Note also that for the above-noted LPDDR3 device, not all portions of the array are refreshed in every mode. If Vdd reduction or performance improvements are not required, then gains provided through incorporation of MST may be translated to area reduction. More particularly, the gains in Ieff/Ioff may be converted into reducing the sizes of devices in parts of the circuit where the area impact is significant, keeping the same or slightly better performance in those areas.

Figure 16:
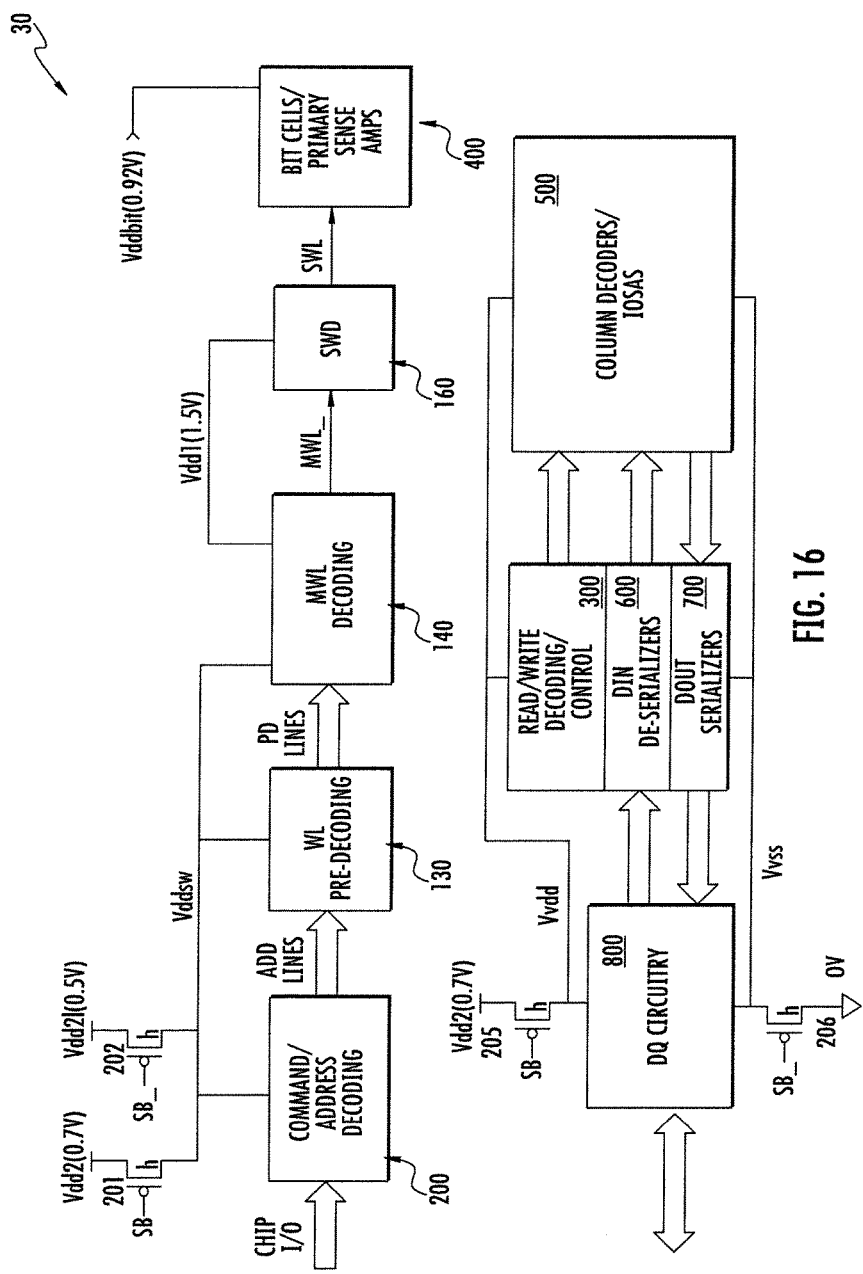
FIG. 16 is a schematic block diagram of another embodiment of the DRAM architecture of FIG. 2 in accordance with an example embodiment.

Turning additionally to the example DRAM architecture 30 of FIG. 16, this embodiment is similar to that shown in FIG. 2, with the exception that in the configuration of FIG. 16 a Vdd2 of 0.7V and a Vdd21 (Vdd2 low) of 0.5V are used. With both configurations, Vddbit primarily only drops due to primary sense amp offset improvement (approximately 8%). Using MST superlattice technology in a bit cell pass gate may advantageously improve Vt variability, so some margin may be removed. However, a bigger effect from pass gate improved variability may be the ability to lower Vdd1 more significantly. In the subsequent calculations, 100 mV is assumed, although this may be different in different embodiments. Also, it assumes MST in a bit cell, although this is not required in all embodiments. A level shifter may be used to handle the spread between Vdd21 and Vdd1 in some embodiments. Also, the power savings numbers and percentages that may be achieved for the above LPDDR3 numbers may be appropriately scaled for future lower voltage levels.

With respect to the first example shown in FIG. 2, the percentage of Power in Vdd2 is 290/(290+8)=97%. Vddbit does not have to be reduced further to affect this power. That is, all pre-charge power is supplied from Vdd2 in periphery, not Vddbit. Moreover, new circuits may be used to transition between lower Vdd2 domain and Vddbit domain, including a level shifter for write and sense amp operation for read. Performance in these modes remains the same at 0.7V with MST overdrive, and the percentage of power used= ((0.49*290)+8)/(290+8)=50.4%. Thus, the estimated percentage of power saved is 100-50.4=49.6%.

With respect to the second example shown in FIG. 16, read and write modes are the dominant source of power consumption during operation. This configuration accordingly operates the read and write paths at 0.7V instead of 1V. TDDB data shows the ability to overdrive by 200-300 mV. This capability may accordingly be used to optimize transistors for less than 0.5V, and overdrive them to 0.7V. Yet, performance may advantageously still be improved significantly over baseline at half the power. If feasible from a circuit standpoint (level shifters, etc.), this may potentially be further reduced to 0.6V while maintaining the same performance as the baseline process at 1V, thereby saving an estimated 64% of power during read and write operations.

For an activate mode, Vdd1 (1.8V)=8 mA. If Vddbit is reduced by 100 mV, Vdd1 may be able to be reduced by an additional 100 mV due to improved Vt variation of the pass gate with MST. As a result, the total savings would be (1−1.62/1.82)*100=21%. Furthermore, where Vddca+Vddq=6 mA, if Vddq may not be reduced, it may be possible to reduce Vddca (Command/Address buss) by 50%. For Vdd2 (1.2V)=41.5 mA, the percentage of Power in Vdd 2=41.5/(41.5+8+6)=75%. The percentage of this power that is attributable to Vddbit is nearly 100% due to the dominance of bit line capacitance (approximately 80ff per bit line). The front end path to word line may be no more than 2-3 pf vs. 100's of pF for bit lines Also, since Vdd2 is dominated by Vddbit, the savings is app. (1−1.12/1.22)*100=16%, where 92% of 1.2 is 1.104. As such, the percentage of power saved=15-20% for LPDDR designs, where standby is very important.

For an all bank auto refresh burst mode where Vdd1 (1.8V)=30 mA, if Vddbit is reduced by 100 mV, Vdd1 may be able to be reduced by an additional 100 mV due to improved Vt variation of a pass gate with a MST superlattice. Total savings may be (1−1.62/1.82)*100=21%. For Vddca+Vddca=6 mA, if Vddq may not be reduced, Vddca (commend/Address buss) may still be reduced by approximately 50%. For Vdd2 (1.2V)=150 mA, the percentage of power in Vdd2=150/(150+30+6)=80%. Moreover, the percentage of this power that is Vddbit is nearly 100% due to dominance of bit line capacitance (approximately 80ff per bit line). The front end path to the wordline may be no more than 2-3 pf vs. 100's of pF for bit lines. Since Vdd2 is dominated by Vddbit, the savings is approximately (1−1.12/1.22)*100=16%, where 92% of 1.2 is 1.104. The percentage of power saved=15-20% for LPDDR designs, where standby is more important. With respect to the above-described approach of further reduction of Vddbit for servers (DDR designs), this would increase refresh current due to more frequent refreshes required.

Turning again to the example of FIG. 16, with respect to the power savings in standby mode IDD6, this is an important consideration for portable or mobile devices. More particularly, $CV^2f$ power on the bit lines during refresh is a dominant source of power during standby. By operating Vddbit at 0.92V instead of 1V, using the MST superlattice it is estimated that a 40% mismatch improvement for NMOS may be achieved. Moreover, lowering Vddbit may be limited by tail bit yield, and thus improving NMOS offset by 40% in the primary sense amplifiers can translate into an 8% reduction in Vddbit. This translates to a 15% saving in standby power (IDD6). Applicant theorizes, without wishing to be bound thereto, that the mismatch may be improved by as much as 60% using the above-described approach, which would translate into a 23% reduction in IDD6.

To summarize, for computationally-intensive applications where caching is effective, the estimated savings would be approximately 50%. That is, these are situations dominated by read and write operations without the need to activate the word lines very often. For refresh modes, the savings may be approximately 15-20%. This is based upon the amount of offset improvement that may be achieved in the primary sense amps, for example. Increasing the improvement in Vt variation from 40% to 60% may further increase this number to 25-30%. Moreover, reducing Vddbit may not necessarily help Idd6 since the higher necessary frequency of refresh operations may offset the CV2f savings on the bit lines.

For server farms, the percentage of activate operations vs. read or write operations may be higher due to the fully random nature of the packets. This is where reducing Vddbit may be beneficial, since the percentage of time spent in refresh is very low.

A description of the above-noted MST technology which may be used in DRAM memory cells in accordance with the present application is now provided. Generally speaking, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $M_e^{-1}$ and $M_h^{-1}$ for electrons and holes respectively, defined as:

$$M_{e,i,j}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,i,j}^{-1}(E_F, T) = \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 11:
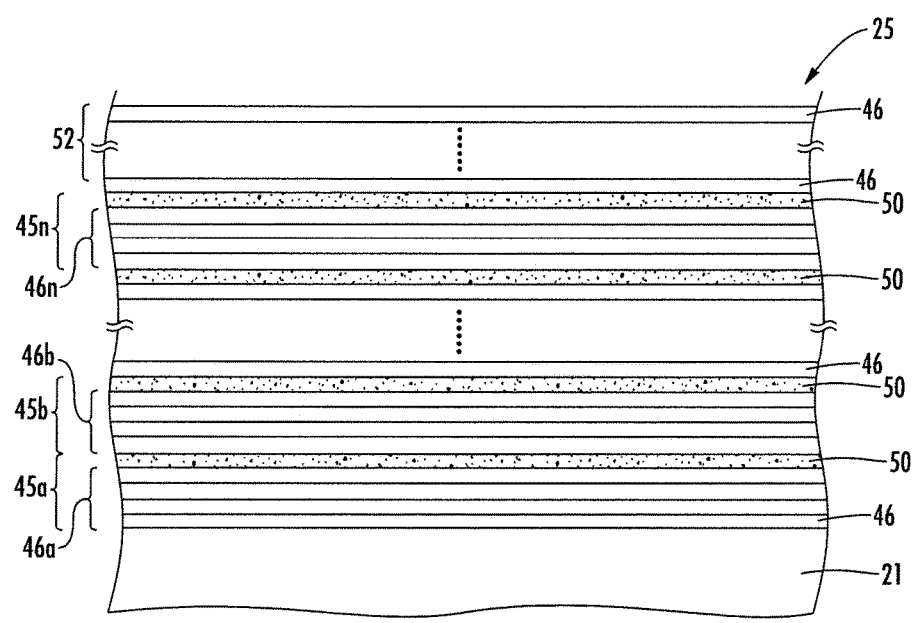
FIG. 11 is a greatly enlarged schematic cross-sectional view of a superlattice for use in a semiconductor device in accordance with an example embodiment.
Figure 12:
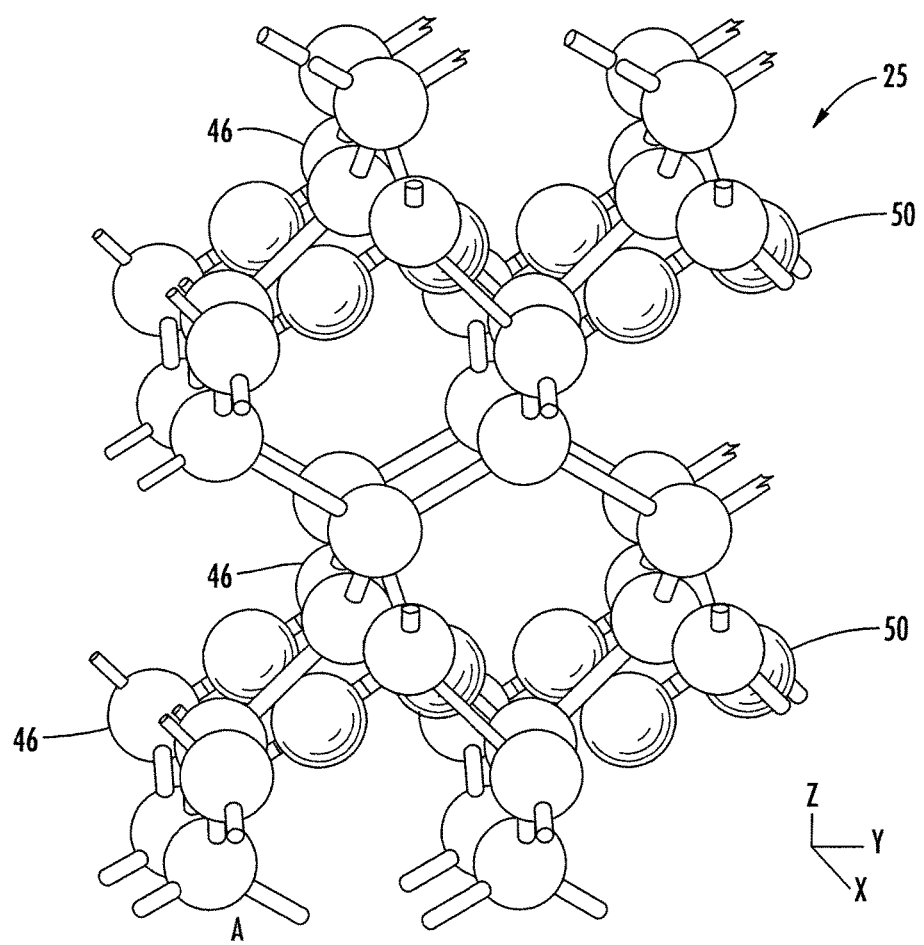
FIG. 12 is a perspective schematic atomic diagram of a portion of the superlattice shown in FIG. 11.

Referring now to FIGS. 11 and 12, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 11.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 11 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 12. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 12, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 11 and 12, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 13:
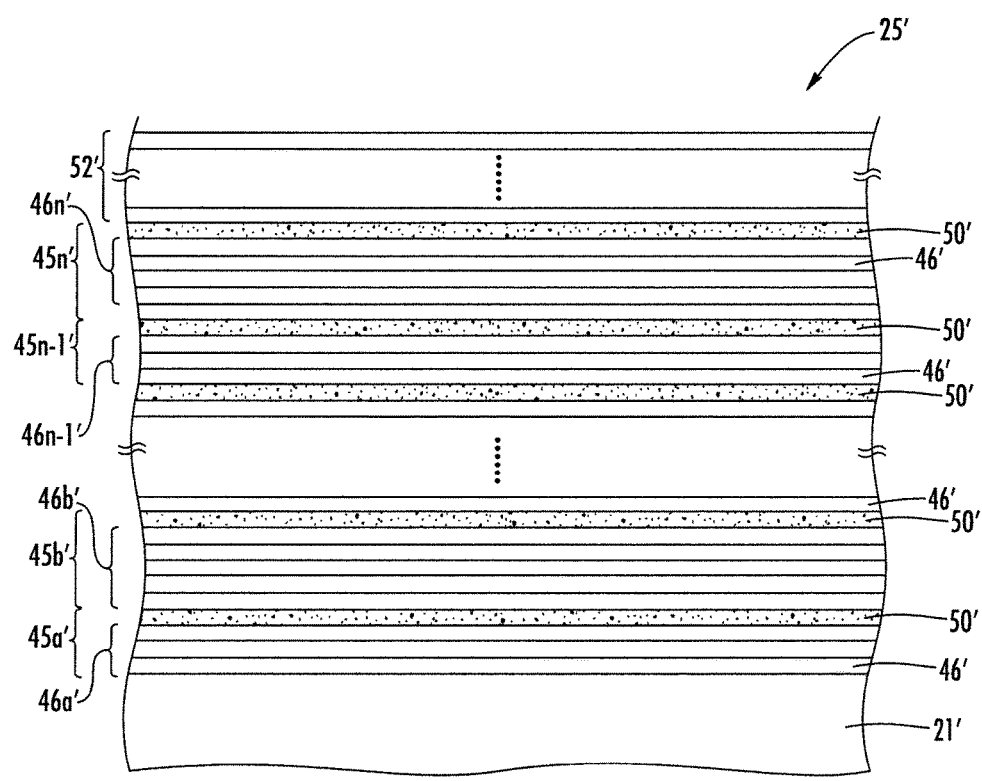
FIG. 13 is a greatly enlarged schematic cross-sectional view of another embodiment of a superlattice in accordance with an example embodiment.

Indeed, referring now additionally to FIG. 13, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 13 not specifically mentioned are similar to those discussed above with reference to FIG. 11 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 14A:
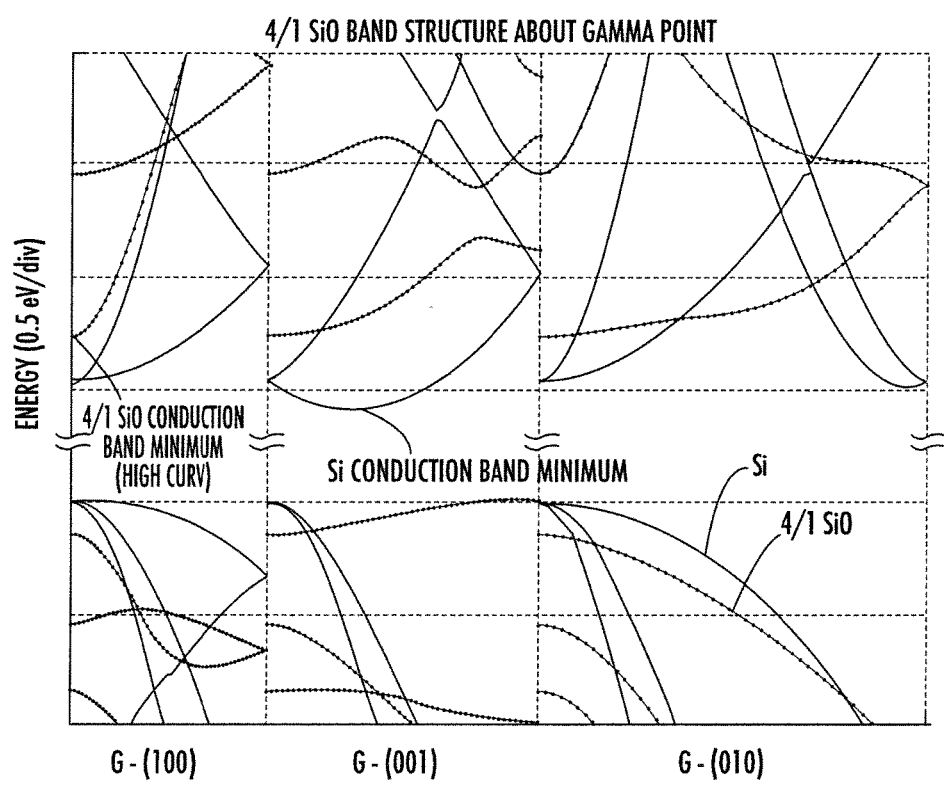
FIG. 14A is a graph of the calculated band structure from the gamma point (G) for both bulk silicon as in the prior art, and for the 4/1 Si/O superlattice as shown in FIGS. 11-12.
Figure 14B:
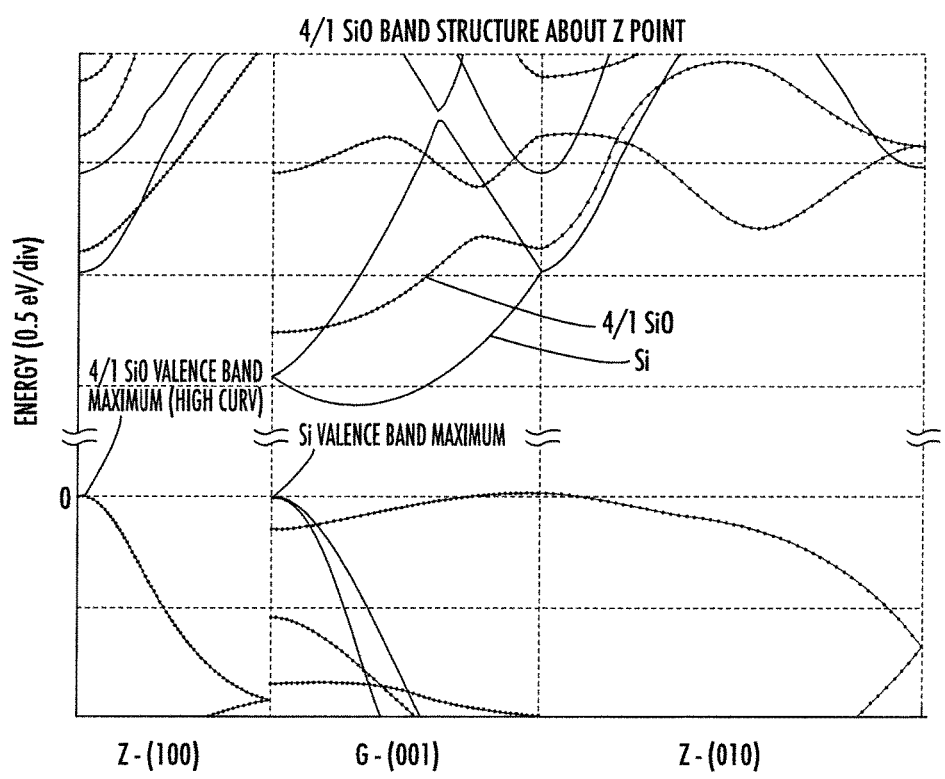
FIG. 14B is a graph of the calculated band structure from the Z point for both bulk silicon as in the prior art, and for the 4/1 Si/O superlattice as shown in FIGS. 11-12.
Figure 14C:
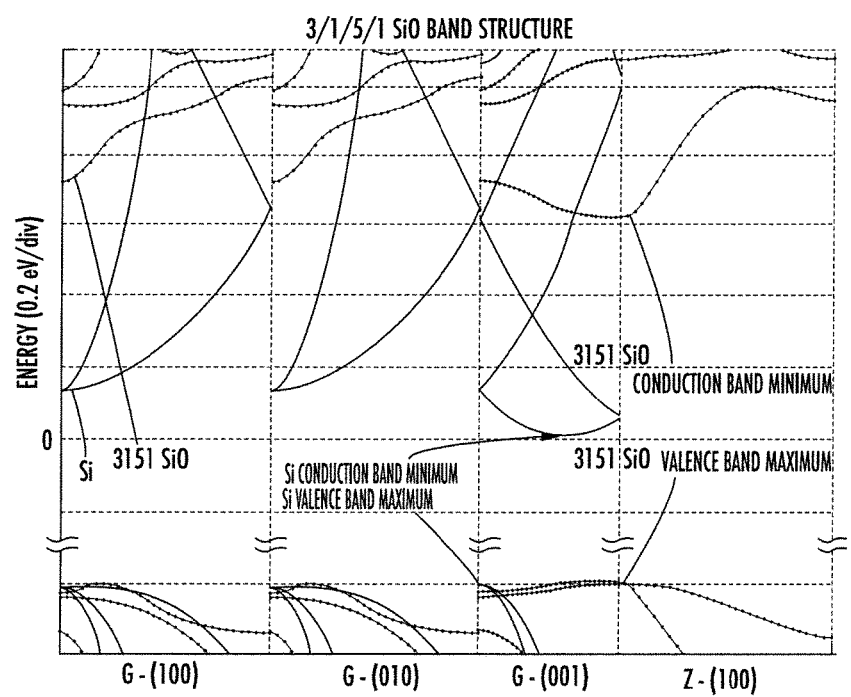
FIG. 14C is a graph of the calculated band structure from both the gamma and Z points for both bulk silicon as in the prior art, and for the 5/1/3/1 Si/O superlattice as shown in FIG. 13.

In FIGS. 14A-14C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 14A shows the calculated band structure from the gamma point (G) for both bulk silicon (represented by continuous lines) and for the 4/1 Si/O superlattice 25 shown in FIG. 11 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 14B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 14C shows the calculated band structure from both the gamma and Z point for both bulk silicon (continuous lines) and for the 5/1/3/1 Si/O structure of the superlattice 25' of FIG. 13 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Further details regarding the implementation of MST technology in a semiconductor memory device may be found in the above-noted U.S. Pat. No. 7,659,539 to Kreps et al., for example.

Many modifications and other embodiments will come to the mind of one skilled in the art having the benefit of the teachings presented herein. Therefore, it is understood that the disclosure is not to be limited to the specific exemplary embodiments disclosed herein.

That which is claimed is:

1. A semiconductor device comprising:
    a plurality of volatile memory cells;
    peripheral circuitry coupled to the plurality of volatile memory cells and comprising a plurality of low threshold voltage (Vt) transistors configured to provide high speed operation during a first operating mode and a plurality of high Vt transistors configured as headers to reduce leakage in the low Vt transistors during a second operating mode, the high Vt and low Vt transistors each comprising a superlattice, the superlattice comprising a plurality of stacked groups of layers with each group of layers comprising a plurality of stacked base semiconductor monolayers defining a base semiconductor portion and at least one non-semiconductor monolayer thereon constrained within a crystal lattice of adjacent base semiconductor portions;
    a first power switching device configured to couple the at least one peripheral circuit to a first voltage supply during the first operating mode; and
    a second power switching device configured to couple the at least one peripheral circuit to a second voltage supply lower than the first voltage supply during the second operating mode;

wherein the peripheral circuitry is operable at a first clock rate during the first operating mode and a second clock rate lower than the first clock rate during the second operating mode, and wherein data stored in the plurality of volatile memory cells is fully refreshed during the second operating mode.

2. The semiconductor device of claim 1 wherein the first operating mode comprises an active mode, and wherein the second operating mode comprises a standby mode.

3. The semiconductor device of claim 1 wherein the peripheral circuitry comprises a sense amplifier.

4. The semiconductor device of claim 1 wherein the peripheral circuitry comprises a main wordline decoder (MWD) circuit.

5. The semiconductor device of claim 4 wherein the peripheral circuitry further comprises a wordline pre-decoder circuit coupled to the MWD circuitry.

6. The semiconductor device of claim 1 wherein the peripheral circuitry comprises an address decoder circuit.

7. The semiconductor device of claim 1 wherein each of the high Vt and low Vt transistors comprises a source and a drain, and wherein the superlattice defines a channel between the source and the drain.

8. The semiconductor device of claim 1 wherein each base semiconductor portion comprises silicon.

9. The semiconductor device of claim 1 wherein each base semiconductor portion comprises germanium.

10. The semiconductor device of claim 1 wherein the at least one non-semiconductor monolayer comprises a non-semiconductor selected from the group consisting of oxygen, nitrogen, fluorine, and carbon-oxygen.

11. The semiconductor device of claim 1 wherein at least some semiconductor atoms from opposing base semiconductor portions of each superlattice layer are chemically bound together through the non-semiconductor layer therebetween.

12. A semiconductor device comprising:
a plurality of volatile memory cells;
peripheral circuitry coupled to the plurality of volatile memory cells and comprising a plurality of low threshold voltage (Vt) transistors configured to provide high speed operation during an active mode and a plurality of high Vt transistors configured as headers to reduce leakage in the low Vt transistors during a standby mode, the high Vt and low Vt transistors each comprising a superlattice, the superlattice comprising a plurality of stacked groups of layers with each group of layers comprising a plurality of stacked base semiconductor monolayers defining a base semiconductor portion and at least one non-semiconductor monolayer thereon constrained within a crystal lattice of adjacent base semiconductor portions;
a first power switching device configured to couple the at least one peripheral circuit to a first voltage supply during the active mode; and
a second power switching device configured to couple the at least one peripheral circuit to a second voltage supply lower than the first voltage supply the standby mode;
wherein the peripheral circuitry comprises a sense amplifier;
wherein the peripheral circuit circuitry is operable at a first clock rate during the first operating mode and a second clock rate lower than the first clock rate during the second operating mode, and wherein data stored in the plurality of volatile memory cells is fully refreshed during the second operating mode.

13. The semiconductor device of claim 12 wherein the peripheral circuitry further comprises a main wordline decoder (MWD) circuit.

14. The semiconductor device of claim 13 wherein the peripheral circuitry further comprises a wordline pre-decoder circuit coupled to the MWD circuitry.

15. The semiconductor device of claim 12 wherein the peripheral circuitry further comprises an address decoder circuit.

16. The semiconductor device of claim 12 wherein each base semiconductor portion comprises silicon, and wherein the at least one non-semiconductor monolayer comprises oxygen.

17. A method for making a semiconductor device comprising:
forming a plurality of volatile memory cells;
forming peripheral circuitry coupled to the plurality of volatile memory cells and comprising a plurality of low threshold voltage (Vt) transistors configured to provide high speed operation during a first operating mode and a plurality of high Vt transistors configured as headers to reduce leakage in the low Vt transistors during a second operating mode, the high Vt and low Vt transistors each comprising a superlattice, the superlattice comprising a plurality of stacked groups of layers with each group of layers comprising a plurality of stacked base semiconductor monolayers defining a base semiconductor portion and at least one non-semiconductor monolayer thereon constrained within a crystal lattice of adjacent base semiconductor portions;
forming a first power switching device configured to couple the at least one peripheral circuit to a first voltage supply during the first operating mode; and
forming a second power switching device configured to couple the at least one peripheral circuit to a second voltage supply lower than the first voltage supply during a the second operating mode;
wherein the peripheral circuitry is operable at a first clock rate during the first operating mode and a second clock rate lower than the first clock rate during the second operating mode, and wherein data stored in the plurality of volatile memory cells is fully refreshed during the second operating mode.

18. The method of claim 17 wherein the first operating mode comprises an active mode, and wherein the second operating mode comprises a standby mode.

19. The method of claim 17 wherein the peripheral circuitry comprises a sense amplifier.

20. The method of claim 17 wherein the peripheral circuitry comprises a main wordline decoder (MWD) circuit.

21. The method of claim 20 wherein the peripheral circuitry further comprises a wordline pre-decoder circuit coupled to the MWD circuitry.

22. The method of claim 17 wherein the peripheral circuitry comprises an address decoder circuit.

23. The method of claim 17 wherein each base semiconductor portion comprises silicon, and wherein the at least one non-semiconductor monolayer comprises oxygen.

* * * * *